US011024720B2

(12) United States Patent
Xie et al.

(10) Patent No.: US 11,024,720 B2
(45) Date of Patent: Jun. 1, 2021

(54) NON-SELF ALIGNED CONTACT SEMICONDUCTOR DEVICES

(71) Applicant: International Business Machines Corporation, Armonk, NY (US)

(72) Inventors: Ruilong Xie, Niskayuna, NY (US); Hari Prasad Amanapu, Guilderland, NY (US); Kangguo Cheng, Schenectady, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 78 days.

(21) Appl. No.: 16/351,999

(22) Filed: Mar. 13, 2019

(65) Prior Publication Data
US 2020/0295151 A1    Sep. 17, 2020

(51) Int. Cl.
| | | |
|---|---|---|
| *H01L 29/45* | (2006.01) | |
| *H01L 29/40* | (2006.01) | |
| *H01L 21/3105* | (2006.01) | |
| *H01L 29/423* | (2006.01) | |
| *H01L 29/417* | (2006.01) | |
| *H01L 29/78* | (2006.01) | |

(52) U.S. Cl.
CPC ...... *H01L 29/456* (2013.01); *H01L 21/31053* (2013.01); *H01L 29/401* (2013.01); *H01L 29/41791* (2013.01); *H01L 29/42364* (2013.01); *H01L 29/785* (2013.01)

(58) Field of Classification Search
CPC ............ H01L 29/456; H01L 21/31053; H01L 29/42364; H01L 29/401; H01L 29/41791; H01L 29/785
See application file for complete search history.

(56) References Cited

U.S. PATENT DOCUMENTS

| | | |
|---|---|---|
| 6,544,193 B2 | 4/2003 | Abreu |
| 7,056,179 B2 | 6/2006 | Courtney |
| 7,361,537 B2 | 4/2008 | Park |
| 7,932,557 B2 | 4/2011 | Rudeck |
| 8,785,999 B2 | 7/2014 | Nishi |
| 8,815,689 B2 | 8/2014 | Lee et al. |
| 9,412,840 B1 | 8/2016 | Leobandung et al. |
| 9,570,573 B1 | 2/2017 | Fan et al. |

(Continued)

FOREIGN PATENT DOCUMENTS

WO    8911732 A1    11/1989

OTHER PUBLICATIONS

Ryckaert, J., et al. "DTCO at N7 and beyond: patterning and electrical compromises and opportunities." Proc. of SPIE vol. 9427 94270C-1. Mar. 2015. 8 pages.

*Primary Examiner* — Steven H Loke
*Assistant Examiner* — Juanita B Rhodes
(74) *Attorney, Agent, or Firm* — Amin, Turocy & Watson, LLP

(57) ABSTRACT

Techniques regarding non-SAC semiconductor devices are provided. For example, one or more embodiments described herein can comprise an apparatus, which can further comprise a gate positioned adjacent a channel region of a semiconductor body for a field effect transistor. The gate can comprise a metal liner, and wherein the metal liner is an interface between a first metal layer of the gate and a second metal layer of the gate.

20 Claims, 11 Drawing Sheets

(56) References Cited

U.S. PATENT DOCUMENTS

| | | |
|---|---|---|
| 9,818,876 B1 | 11/2017 | Bouche |
| 10,074,564 B2 | 9/2018 | Chanemougame et al. |
| 2005/0249667 A1 | 11/2005 | Tuszynski et al. |
| 2008/0099851 A1* | 5/2008 | Hsu ................. H01L 21/823842 257/369 |
| 2013/0075833 A1* | 3/2013 | Liu ................... H01L 21/28008 257/411 |
| 2014/0183651 A1* | 7/2014 | Lee ................. H01L 21/823857 257/369 |
| 2017/0077256 A1 | 3/2017 | Adusumilli et al. |
| 2017/0278747 A1* | 9/2017 | Adusumilli ........... H01L 23/485 |
| 2017/0358497 A1* | 12/2017 | Cheng ............ H01L 21/823481 |

* cited by examiner

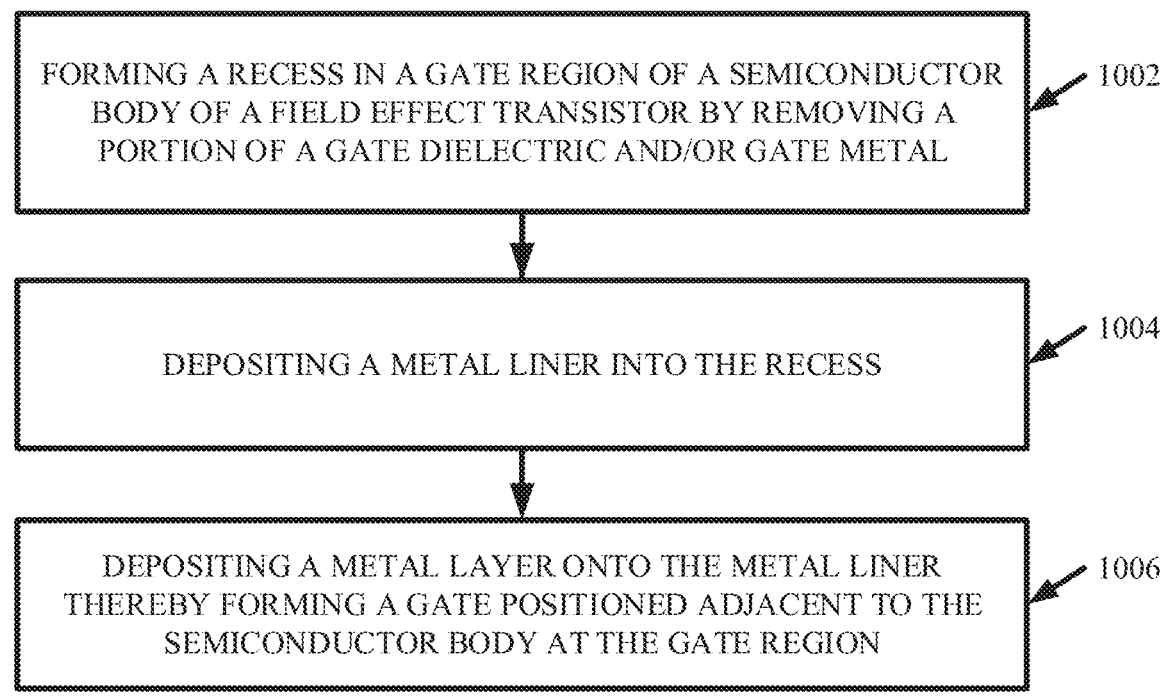

1102 — FORMING A FIRST RECESS IN A SOURCE/DRAIN REGION OF A SEMICONDUCTOR BODY OF A FET, WHEREIN THE SEMICONDUCTOR BODY COMPRISES A GATE REGION POSITIONED LATERALLY ADJACENT TO THE SOURCE/DRAIN REGION, AND WHEREIN A DIELECTRIC SIDEWALL SPACER IS COMPRISED WITHIN THE GATE REGION

1104 — DEPOSITING A SACRIFICIAL LAYER INTO THE FIRST RECESS

1106 — FORMING A SECOND RECESS IN THE GATE REGION BY REMOVING A PORTION OF A GATE DIELECTRIC AND/OR GATE METAL

1108 — FORMING A THIRD RECESS IN THE SOURCE/DRAIN REGION BY REMOVING THE SACRIFICIAL LAYER

1110 — DEPOSITING A METAL LINER INTO THE SECOND RECESS

1112 — DEPOSITING THE METAL LINER INTO THE THIRD RECESS

1114 — DEPOSITING A METAL LAYER ONTO THE METAL LINER WITHIN THE SECOND RECESS THEREBY FORMING A GATE POSITIONED ADJACENT TO THE SEMICONDUCTOR BODY AT THE GATE REGION

1116 — DEPOSITING THE METAL LAYER ONTO THE METAL LINER WITHIN THE THIRD RECESS TO FORM A METAL PLUG POSITIONED ADJACENT TO THE SEMICONDUCTOR BODY AT THE SOURCE/DRAIN REGION

1118 — PERFORMING A CMP TO THE FET TO REMOVE EXCESS OF THE METAL LAYER COVERING THE GATE, DIELECTRIC SIDEWALL SPACER, AND METAL PLUG

NON-SELF ALIGNED CONTACT SEMICONDUCTOR DEVICES

BACKGROUND

The subject disclosure relates to non-self aligned contact ("non-SAC") semiconductor devices, and more specifically, to manufacturing methods and/or structures for enabling non-SAC semiconductors for beyond 7 nanometer (nm) technology.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can regard Non-SAC semiconductor devices are described.

According to an embodiment, an apparatus is provided. The apparatus can comprise a gate positioned adjacent a channel region of a semiconductor body for a field effect transistor. The gate can comprise a metal liner, and wherein the metal liner can be an interface between a first metal layer of the gate and a second metal layer of the gate.

According to an embodiment, a method is provided. The method can comprise forming a recess in a gate region of a semiconductor body of a field effect transistor by removing a portion of a gate metal. The method can also comprise depositing a metal liner into the recess. The method can further comprise depositing a metal layer onto the metal liner thereby forming a gate positioned adjacent to the semiconductor body at the gate region.

According to an embodiment, apparatus is provided. The apparatus can comprise a semiconductor body for a field effect transistor comprising a gate region positioned laterally adjacent to a source/drain region. The apparatus can also comprise a multilayer structure positioned at both the gate region and the source/drain region, wherein the multilayer structure comprises a metal liner and a metal layer.

BRIEF DESCRIPTION OF THE DRAWINGS

FIG. 10 illustrates a flow diagram of an example, non-limiting method that can facilitate manufacturing of a non-SAC semiconductor device in accordance with one or more embodiments described herein.

FIG. 11 illustrates a flow diagram of an example, non-limiting method that can facilitate manufacturing of a non-SAC semiconductor device in accordance with one or more embodiments described herein.

DETAILED DESCRIPTION

Figure 1A:
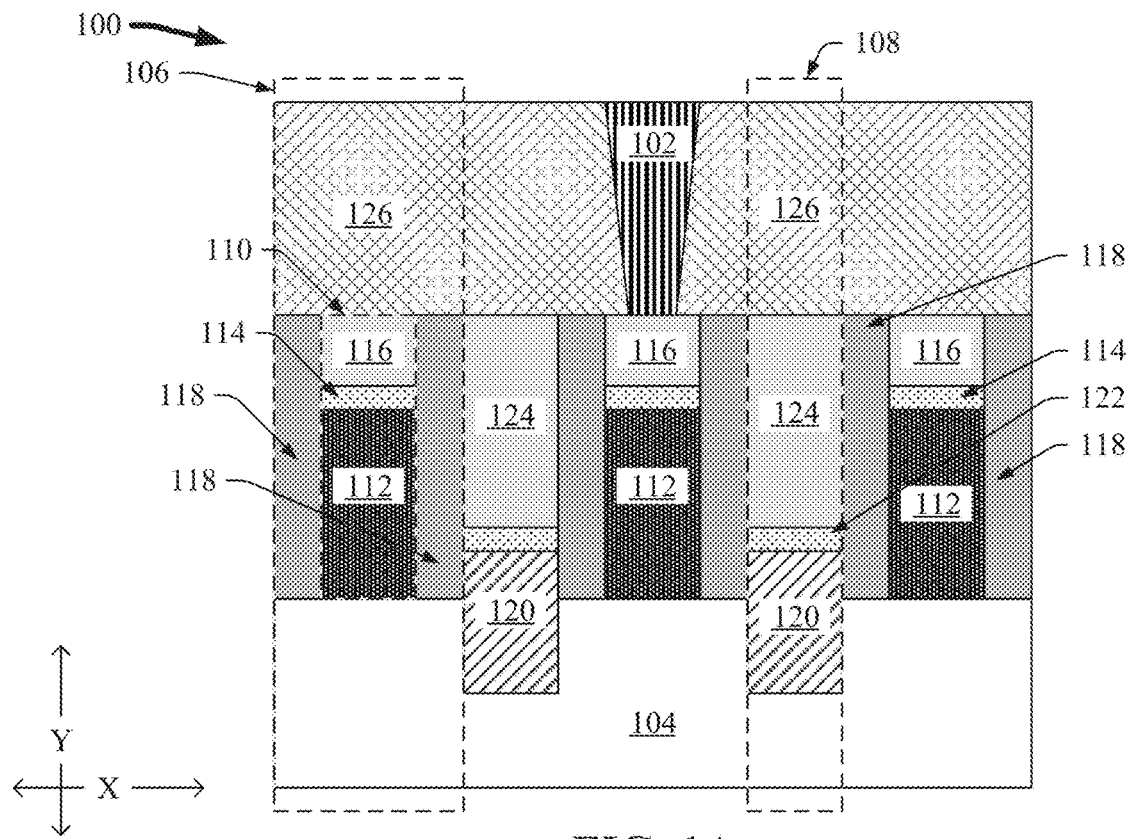
FIG. 1A illustrates a diagram of an example, non-limiting cross-sectional view of a non-SAC semiconductor device that can comprise one or more multi-layered gate contacts and/or local interconnects in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, coloring, shading, and/or cross-hatching depicted in the drawings can denote common features and/or material compositions.

The semiconductor industry has adopted non-SAC middle-of-the-line ("MOL") manufacturing methods due to ease, low cost, the absence of complex modules (e.g., work function metal chamfering, tungsten gate recess, SAC cap formation, and/or SAC etch). However, conventional non-SAC MOL techniques can have a variety of drawbacks. For example, one or more conventional non-SAC MOL techniques prohibit formation of the gate contact within an active region of the semiconductor device (e.g., thereby causing one or more scaling penalties). Other non-SAC MOL techniques can comprise one or more structural weak points due to reactive-ion etch ("RIE") erosion caused when one or more gates are not perfectly aligned during formation. For example, sidewall spacers flanking the one or more gates can undergo erosion from the RIE used during formation of one or more local interconnects.

Various embodiments described herein can regard apparatuses, systems, and/or methods regarding non-SAC techniques (e.g., non-SAC MOL techniques) that can facilitate formation of one or more gates within one or more active regions while minimizing structural erosion. For example, one or more embodiments described herein can regard one or more non-SAC semiconductor devices comprising a multi-layered gate structure, wherein a metal liner can serve as an interface between a gate stack layer (e.g., a high dielectric constant metal) and a second metal layer (e.g., cobalt). Further, in various embodiments, one or more metal plugs positioned over the source/drain regions can also comprise a multi-layered structure and serve as a local interconnect. For example, the one or more metal plugs can comprise the metal liner and second metal layer (e.g., cobalt). In one or more embodiments, the metal liner composition and/or the second metal composition can be the same, or substantially the same, in the structure of both the one or more metal gates and/or metal plugs. In addition, in various embodiments, one or more sidewall spacers positioned between the gates and metal plugs can be free from erosion (e.g., can have a uniform height across the width of the sidewall spacers, and vise versa).

FIG. 1A illustrates a diagram, on an example, non-limiting cross-sectional view of a non-SAC semiconductor device 100 in accordance with one or more embodiments described herein. Repetitive description of like elements employed in other embodiments described herein is omitted for sake of brevity. For example, FIG. 1A can depict a cross-sectional view of the non-SAC semiconductor device 100 align a plane comprising one or more gate contacts 102. As shown in FIG. 1A the non-SAC semiconductor device 100 can be a non-SAC field effect transistor (e.g., a fin field effect transistor ("FinFET")).

The one or more non-SAC semiconductor devices 100 can comprise one or more semiconductor substrates 104. The one or more semiconductor substrates 104 can support one or more features of the one or more non-SAC semiconductor devices 100. Example materials that can be comprised within the one or more semiconductor substrates 104 can include, but are not limited to: silicon, germanium, silicon carbide, carbon doped silicon, compound semiconductors (e.g., comprising elements from periodic table groups III, IV, and/or V), silicon oxide, a combination thereof, and/or the like. For instance, the one or more semiconductor substrates 104 can be a bulk silicon wafer and/or a silicon-on-insulator ("SOT") wafer. Additionally, the one or more semiconductor substrates 104 can comprise electronic structures such as isolation wires (not shown). Further, the one or more semiconductor substrates 104 can be characterized by one or more crystalline structures. For example, the one or more semiconductor substrates 104 can comprise silicon <100>, silicon <110>, and/or silicon <111>, as described using Miller indices. For instance, in one or more embodiments the one or more semiconductor substrates 104 can comprise silicon oxide.

As shown in FIG. 1A, the one or more non-SAC semiconductor devices 100 can comprise one or more gate regions 106 and/or source/drain regions 108. For clarity, FIG. 1A delineates a gate region 106 and a source/drain region 108 with dashed lines; although one of ordinary skill in the art will recognize that FIG. 1A depicts three gate regions 106 and/or two source/drain regions 108. The one or more gate regions 106 can be positioned laterally (e.g., along the "X" axis) adjacent to one or more source/drain regions 108. For example, a source/drain region 108 can be positioned between adjacent gate regions 106 (e.g., as shown in FIG. 1A). As shown in FIG. 1A, the one or more gate regions 106 can comprise one or more fin channels of the semiconductor substrate 104 and/or one or more gate contacts 102. Also shown in FIG. 1A, the one or more source/drain regions 108 can comprise one or more trenches formed into the semiconductor substrate 104.

Further, the one or more gate regions 106 can comprise one or more gates 110 positioned adjacent to the one or more semiconductor substrates 104 (e.g., adjacent to the one or more fin channels of the one or more semiconductor substrates 104). For clarity, FIG. 1A delineates a gate 110 with dashed lines; although one of ordinary skill in the art will recognize that FIG. 1A depicts three gates 110. The one or more gates 110 can comprise one or more gate stack layers 112, metal liners 114, and/or second metal layers 116. The one or more gate stack layers 112 can comprise one or more gate dielectric layers, such as high-k dielectrics (e.g., dielectrics characterized by a high dielectric constant ("k"), such as: hafnium (IV) oxide ($HfO_2$), zirconium dioxide ($ZrO_2$), compounds with the chemical formula $HfZrO_2$, compounds with the chemical formula $HfAlO_x$, compounds with the chemical formula $HfLaO_x$, a combination thereof, and/or the like) and one or more metal layers above the one or more gate dielectric layers. Further, the one or more metal layers of the gate stack layers 112 can be one or more work function metals ("WFM"). Example materials that can be comprised within the one or more metal layers of the gate stack layers 112 can include, but are not limited to: titanium nitride (TiN), titanium carbide (TiC), tantalum nitride (TaN), a combination thereof, and/or the like. Furthermore, the one or more gate stack layers 112 can comprise a low electrical resistance fill metal above the one or more metal layers (e.g., above the one or more WFM layers), such as tungsten. As shown in FIG. 1A, the one or more gate stack layers 112 can be position on top of the one or more semiconductor substrates 104.

The one or more metal liners 114 can be characterized by an affinity to form silicide with an epitaxial wafer. The one or more metal liners 114 can have an exemplary thickness (e.g., along the "Y" axis) that is greater than or equal to 1 nanometer (nm) and less than or equal to 8 nm. Example materials that can be comprised within the one or more metal liners 114 can include, but are not limited to: titanium (Ti), nickel (Ni), nickel-platinum (NiPt), platinum (Pt), a combination thereof, and/or the like. As shown in FIG. 1A, the one or more metal liners 114 can be positioned on top of the one or more gate stack layers 112 (e.g., between the one or sidewall spacers 118). In one or more embodiments, the one or more metal liners 114 can extend across the entire width (e.g., along the "X" axis), or substantially the entire width, of the one or more adjacent gate stack layers 112.

The one or more second metal layers 116 can be characterized by a low electrical resistance. Example materials that can be comprised within the one or more second metal layers 116 can include, but are not limited to: cobalt (Co), ruthenium (Ru), copper (Cu), a combination thereof, and/or the like. As shown in FIG. 1A, the one or more second metal layers 116 can be positioned on top of the one or more metal liners 114 (e.g., between one or more sidewall spacers 118). In one or more embodiments, the one or more second metal layers 116 can extend across the entire width (e.g., along the "X" axis), or substantially the entire width, of the one or more adjacent metal liners 114. Further, the in various embodiments, the one or more second metal layers 116 can extend from the one or more metal liners 114 to a common height (e.g., along the "Y" axis), as described further herein. In addition, one or more sidewall spacers 118 can positioned on the lateral sides of the one or more gates 110 (e.g., along the "X" axis, as shown in FIG. 1A) and/or within the one or more gate regions 106. In various embodiments, the one or more sidewall spacers 118 can be comprised of a dielectric material. Example materials that can be comprised within the one or more sidewall spacers 118 can include, but are not limited to: silicon nitride (SiN), compounds having the chemical formula SiCO, compounds having the chemical formula SiOCN, silicon-boron-carbide-nitride (SiBCN), silicon carbide (SiC), a combination thereof, and/or the like. As shown in FIG. 1A, the one or more sidewall spacers 118 can be characterized as having a width (e.g., along the "X" axis) that can be substantially uniform throughout a height (e.g., along the "Y" axis) of the one or more sidewall spacers 118, and/or vise versa. In other words, the one or more sidewall spacers 118 can exhibit a non-tapered shape.

The one or more source/drain regions 108 can comprise one or more source/drain layers 120, second metal liners 122, and/or third metal layers 124. The one or more source/drain layers 120 can serve as one or more source/drains for the non-SAC semiconductor device 100 (e.g., source/drains for an FET). Example materials that can be comprised within the one or more source/drain layers 120 can include, but are not limited to: epitaxial wafers, boron doped silicon-germanium (SiGe), phosphorous doped silicon, arsenic doped silicon, a combination thereof, and/or the like. As shown in FIG. 1A, the one or more source/drain layers 120 can be positioned within the one or more trenches formed into the one or more semiconductor substrates 104.

The one or more second metal liners 122 can be characterized by an affinity to form silicide with an epitaxial wafer. The one or more second metal liners 122 can have an exemplary thickness (e.g., along the "Y" axis) that is greater than or equal to 1 nm and less than or equal to 8 nm. Example materials that can be comprised within the one or more second metal liners 122 can include, but are not limited to: titanium (Ti), nickel (Ni), nickel-platinum (NiPt), platinum (Pt), a combination thereof, and/or the like. As shown in FIG. 1A, the one or more second metal liners 122 can be positioned on top of the one or more source/drain layers 120 within the source/drain regions 108 (e.g., between the one or sidewall spacers 118). In one or more embodiments, the one or more second metal liners 122 can extend across the entire width (e.g., along the "X" axis), or substantially the entire width, of the one or more adjacent source/drain layers 120. In various embodiments, the one or more second metal liners 122 can have the same, or substantially the same, composition as the one or more metal liners 114. For example, the one or more metal liners 114 and second metal liners 122 can both comprise titanium.

The one or more third metal layers 124 can be characterized by a low electrical resistance. Example materials that can be comprised within the one or more third metal layers 124 can include, but are not limited to: cobalt (Co), ruthenium (Ru), copper (Cu), a combination thereof, and/or the like. As shown in FIG. 1A, the one or more third metal layers 124 can be positioned on top of the one or more second metal liners 122 (e.g., between the one or sidewall spacers 118). In one or more embodiments, the one or more third metal layers 124 can extend across the entire width (e.g., along the "X" axis), or substantially the entire width, of the one or more adjacent second metal liners 122. Further, the in various embodiments, the one or more third metal layers 124 can extend from the one or more second metal liners 122 to a common height (e.g., along the "Y" axis), as described further herein. Moreover, in various embodiments, the one or more third metal layers 124 can have the same, or substantially the same, composition as the one or more second metal layers 116. For example, the one or more second metal layers 116 and third metal layers 124 can both comprise cobalt. In addition, the one or more third metal layers 124 can serve as metal plugs acting as one or more local interconnects for the non-SAC semiconductor device 100.

In one or more embodiments, the non-SAC semiconductor device 100 can also comprise one or more interlayer dielectrics ("ILDs") 126. As shown in FIG. 1A, the ILD 126 can be comprised within the one or more gate regions 106 and/or source/drain regions 108. For example, the one or more ILDs 126 can be positioned over the one or more gates 110 and/or third metal layers 124 (e.g., opposite the one or more semiconductor substrates 104). Example materials that can be comprised within the one or more ILDs 126 can include, but are not limited to: silicon dioxide ($SiO_2$), silicon nitride (SiN), silicon oxynitride (SiON), a low-k dielectric-, a combination thereof, and/or the like. The one or more ILDs 126 can serve to insulate one or more metal lines (e.g., contacts) comprised within the non-SAC semiconductor device 100.

The one or more gate contacts 102 can be comprised within one or more vias positioned within the one or more ILDs 126; thereby the one or more gate contacts 102 can extend through the one or more ILDs 126 (e.g., as shown in FIG. 1A). Example materials that can be comprised within the one or more gate contacts 102 can include an electrically conducting metal (e.g., copper, ruthenium (Ru), a combination thereof, and/or the like). Further, the one or more gate contacts 102 can be comprised within the one or more gate regions 106 and/or can align with, and/or be operably coupled to, the one or more gates 110. For instance, FIG. 1A depicts a gate contact 102 extending through the one or more ILDs 126 and operably coupled to a middle gate 110 (e.g., a gate 110 positioned between two other gates 110 shown in FIG. 1A). One of ordinary skill in the art will recognize that although depicts a singular gate contact 102, the architecture of the non-SAC semiconductor device 100 is not so limited. For example, the non-SAC semiconductor device 100 can comprise a plurality of gate contacts 102.

Figure 1B:
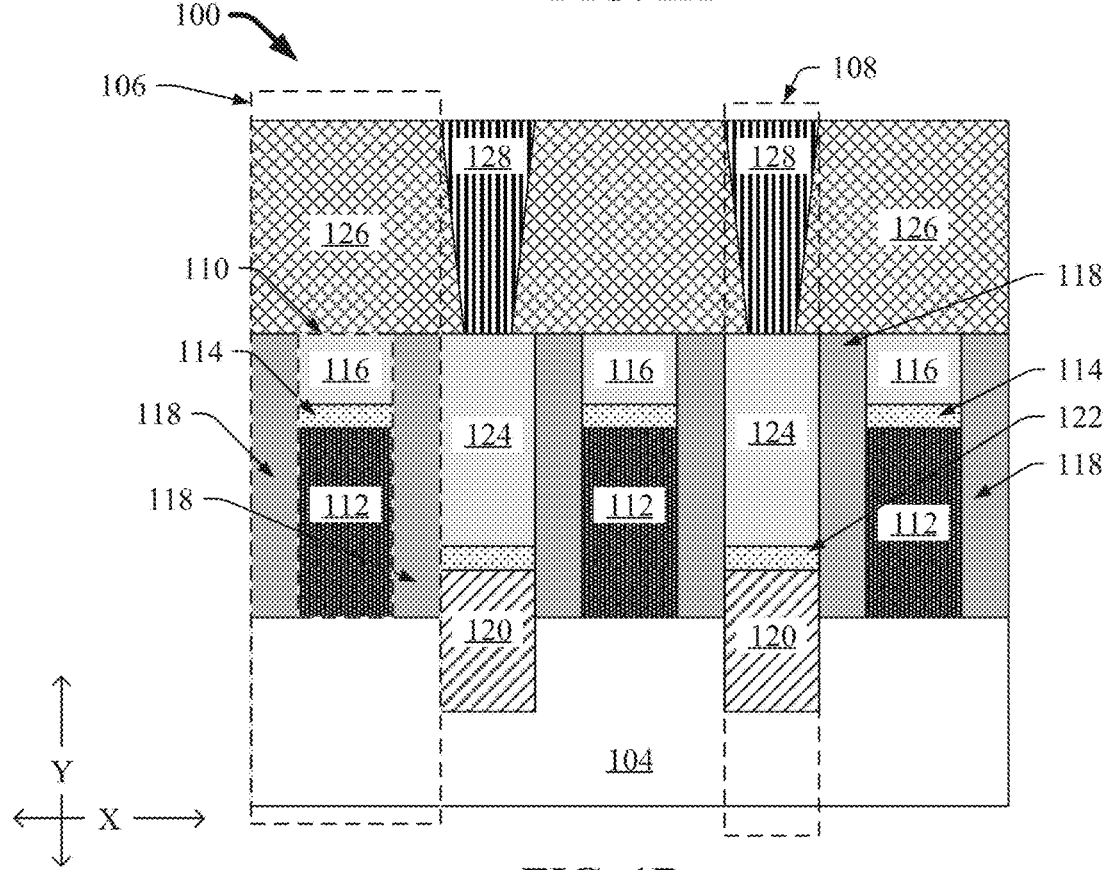
FIG. 1B illustrates a diagram of another example, non-limiting cross-sectional view of the non-SAC semiconductor device that can comprise one or more multi-layered gate contacts and/or local interconnects in accordance with one or more embodiments described herein.

FIG. 1B illustrates a diagram, on another example, non-limiting cross-sectional view of the non-SAC semiconductor device 100 in accordance with one or more embodiments described herein. Repetitive description of like elements employed in other embodiments described herein is omitted for sake of brevity. For example, FIG. 1B can depict a cross-sectional view of the non-SAC semiconductor device 100 align another plane, which can comprise one or more source/drain contacts 128.

The one or more source/drain contacts 128 can be comprised within one or more vias positioned within the one or more ILDs 126; thereby the one or more source/drain contacts 128 can extend through the one or more ILDs 126 (e.g., as shown in FIG. 1B). Example materials that can be comprised within the one or more source/drain contacts 128 can be an electrically conducting metal (e.g., copper, ruthenium (Ru) a combination thereof, and/or the like). Further, the one or more source/drain contacts 128 can be comprised within the one or more source/drain regions 108 and/or can be align with, and/or be operably coupled to, the one or more third metal layers 124 (e.g., metal plugs). For instance, FIG.

1B depicts two source/drain contact 128 extending through the one or more ILDs 126 and operably coupled to the one or more third metal layers 124.

Moreover, in one or more embodiments the one or more gates 110 can comprise one or more thin adhesive metal liners (not shown) positioned: between the one or more second metal layers 116 and the one or more sidewall spacers 118; between the one or more third metal layers 124 and the one or more sidewall spacers 118; and/or between the one or more contacts (e.g., gate contacts 102 and/or source/drain contacts 128) and the one or more ILDs 126. The one or more thin adhesive metal liners can have an exemplary thickness ranging from about 1 nm to about 3 nm. For example, the one or more thin adhesive metal liners can comprise titanium nitride (TiN).

Figure 2:
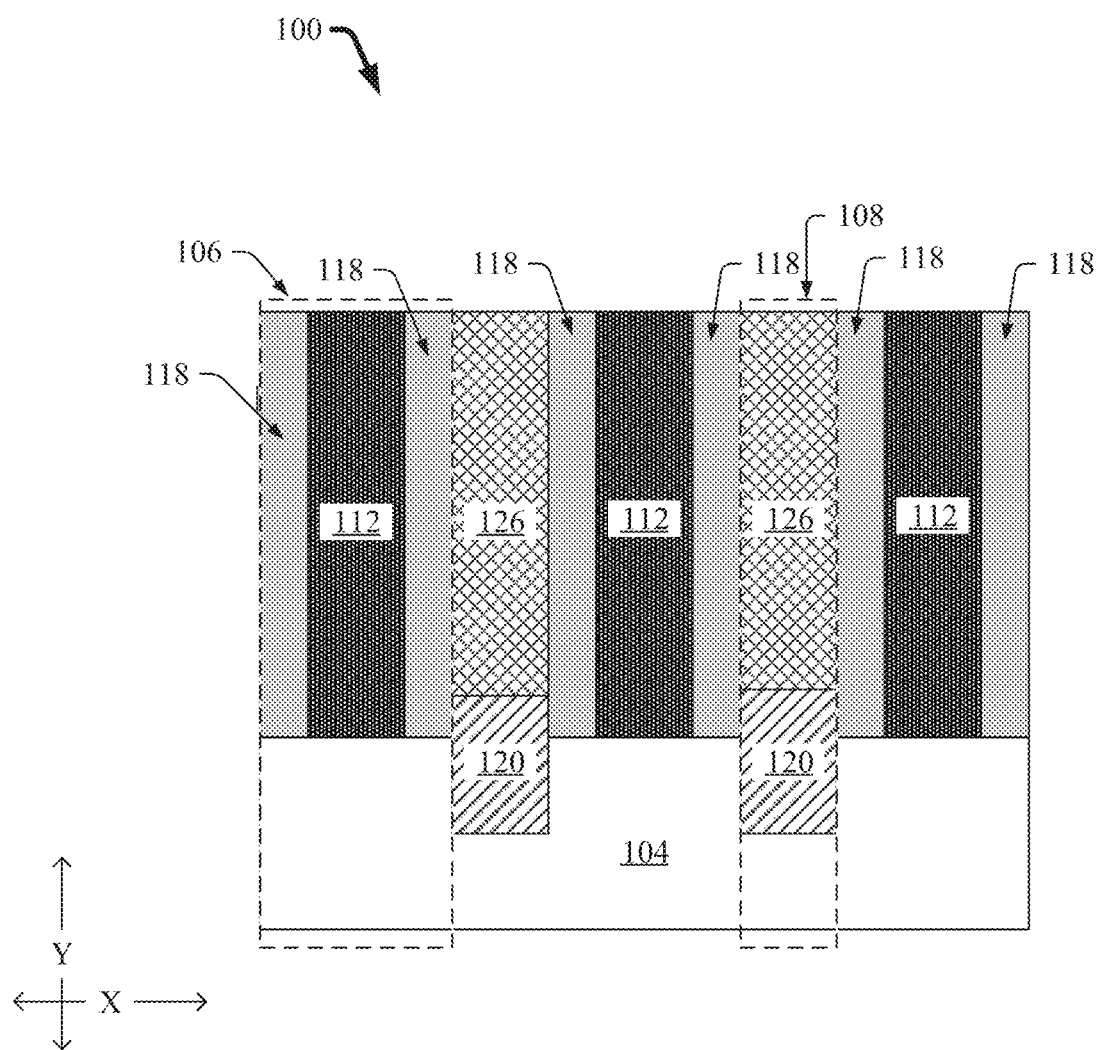
FIG. 2 illustrates a diagram of an example, non-limiting cross-sectional view of a non-SAC semiconductor device during a first stage of manufacturing in accordance with one or more embodiments described herein.

FIG. 2 illustrates a diagram of an example, non-limiting cross-sectional view of the one or more non-SAC semiconductor devices 100 during a first stage of manufacturing in accordance with one or more embodiments described herein. Repetitive description of like elements employed in other embodiments described herein is omitted for sake of brevity.

As shown in FIG. 2, at the first stage of manufacturing the one or more gate regions 106 can comprise the one or more gate stack layers 112 and/or the one or more sidewall spacers 118. Further, the one or more source/drain regions 108 can comprise the one or more source/drain layers 120 along with one or more ILDs 126. At the first stage of manufacturing, the one or more metal liners 114, second metal layers 116, second metal liners 122, and/or third metal layers 124 have yet to be formed. The one or more ILDs 126 comprised within the one or more source/drain regions 108 at the first stage of manufacturing can be positioned on top of the one or more source/drain layers 120 and/or between sidewall spacers 118 (e.g., as shown in FIG. 2).

In one or more embodiments, the one or more ILDs 126 can extend across the entire width (e.g., along the "X" axis), or substantially the entire width, of the one or more adjacent source/drain layers 120. Further, in various embodiments, the one or more ILDs 126 shown in FIG. 2 can comprise the same, or substantially the same, composition as the one or more ILDs 126 shown in FIG. 1A and/or B (e.g., the same, or substantially the same, composition as the one or more ILDs 126 comprised within the finished non-SAC semiconductor device 100 structure described herein). Alternatively, in various embodiments, the one or more ILDs 126 shown in FIG. 2 can comprise a different composition than the one or more ILDs 126 shown in FIG. 1A and/or B (e.g., a different composition than the one or more ILDs 126 comprised within the finished non-SAC semiconductor device 100 structure described herein).

Figure 3:
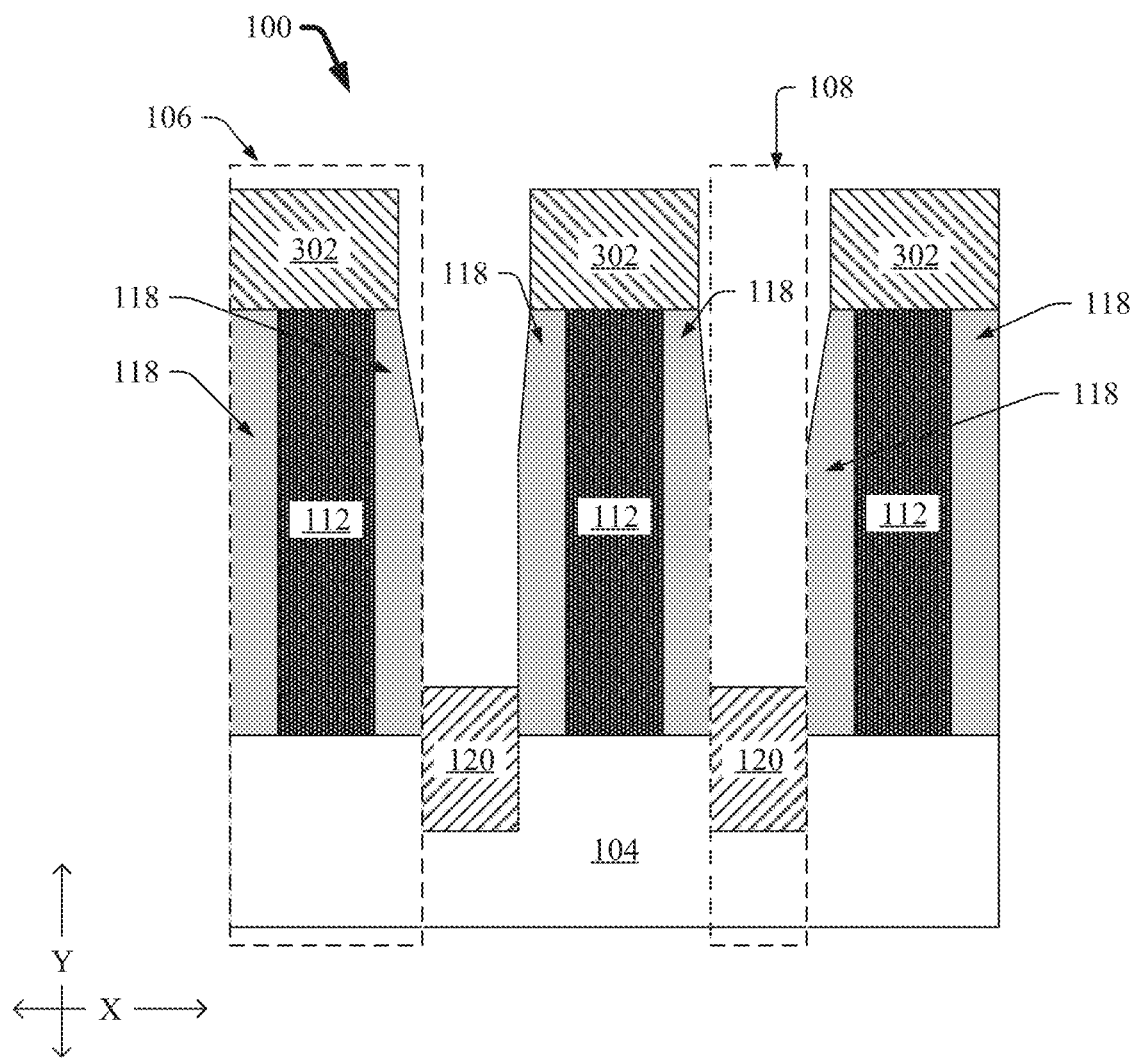
FIG. 3 illustrates a diagram of an example, non-limiting cross-sectional view of a non-SAC semiconductor device during a second stage of manufacturing in accordance with one or more embodiments described herein.

FIG. 3 illustrates a diagram of an example, non-limiting cross-sectional view of the one or more non-SAC semiconductor devices 100 during a second stage of manufacturing in accordance with one or more embodiments described herein. Repetitive description of like elements employed in other embodiments described herein is omitted for sake of brevity.

As shown in FIG. 3, at a second stage of manufacturing the one or more ILDs 126 comprised within the one or more source/drain regions 108 can be removed. For example, the one or more ILDs 126 comprised within the one or more source/drain regions 108 can be removed via one or more etching processes. Example etching processes that can be implemented to remove the one or more ILDs 126 comprised within the one or more source/drain regions 108 can include, but are not limited to: RIE, wet etching processes, dry etching processes, plasma etching processes a combination thereof, and/or the like. To facilitate the one or more etching processes, one or more masks 302 can be positioned in the one or more gate regions 106. The one or more masks 302 can be resistant to the one or more etching processes, thereby protecting the one or more features positioned below the one or more masks 302 (e.g., along the "Y" axis). For instance, the one or more masks 302 can be hard masks, soft masks, and/or photoresist masks. Example materials comprised within the one or more masks 302 can include one or more organic planarization layers ("OPLs") and/or the like.

During the second stage of manufacturing, placement misalignments of the one or more masks 302 can result in at least partial degradation of one or more of the sidewall spacers 118. For example, FIG. 3 depicts an instance where the one or more masks 302 do not cover the entire width (e.g., along the "X" axis) of the respective gate regions 106. Thereby, a portion of one or more sidewall spacers 118 can be exposed to the one or more etching processes implemented to remove the one or more ILDs 126 comprised within the one or more source/drain regions 108. As a result of the exposure, the one or more etching processes implemented during the second stage of manufacturing can further remove at least a portion of the one or more sidewall spacers 118 (e.g., as shown in FIG. 3).

For instance, FIG. 3 depicts one or more sidewall spacers 118 that have been at least partially degraded by the one or more etching processes due to exposure from misalignment of the one or more masks 302. One or more sidewall spacers 118 covered by the one or more masks 302 can be characterized as maintaining a non-tapered shape (e.g., as described herein); whereas one or more sidewall spacers 118 exposed to the one or more etching processes can be characterized by a tapered shape. For example, one or more sidewall spacers 118 exposed to the one or more etching processes can be characterized by a width (e.g., along the "X" axis) that is non-uniform through a height (e.g., along the "Y" axis) of the one or more sidewall spacers 118, and/or vice versa. For instance, FIG. 3 depicts one or more partially degraded sidewall spacers 118, wherein a top portion of the one or more exposed sidewall spacers 118 (e.g., a portion nearest the one or more masks 302) can be thinner (e.g., along the "X" axis) than a bottom portion of the one or more exposed sidewall spacers 118 (e.g., a portion nearest the one or more semiconductor substrates 104).

Figure 4:
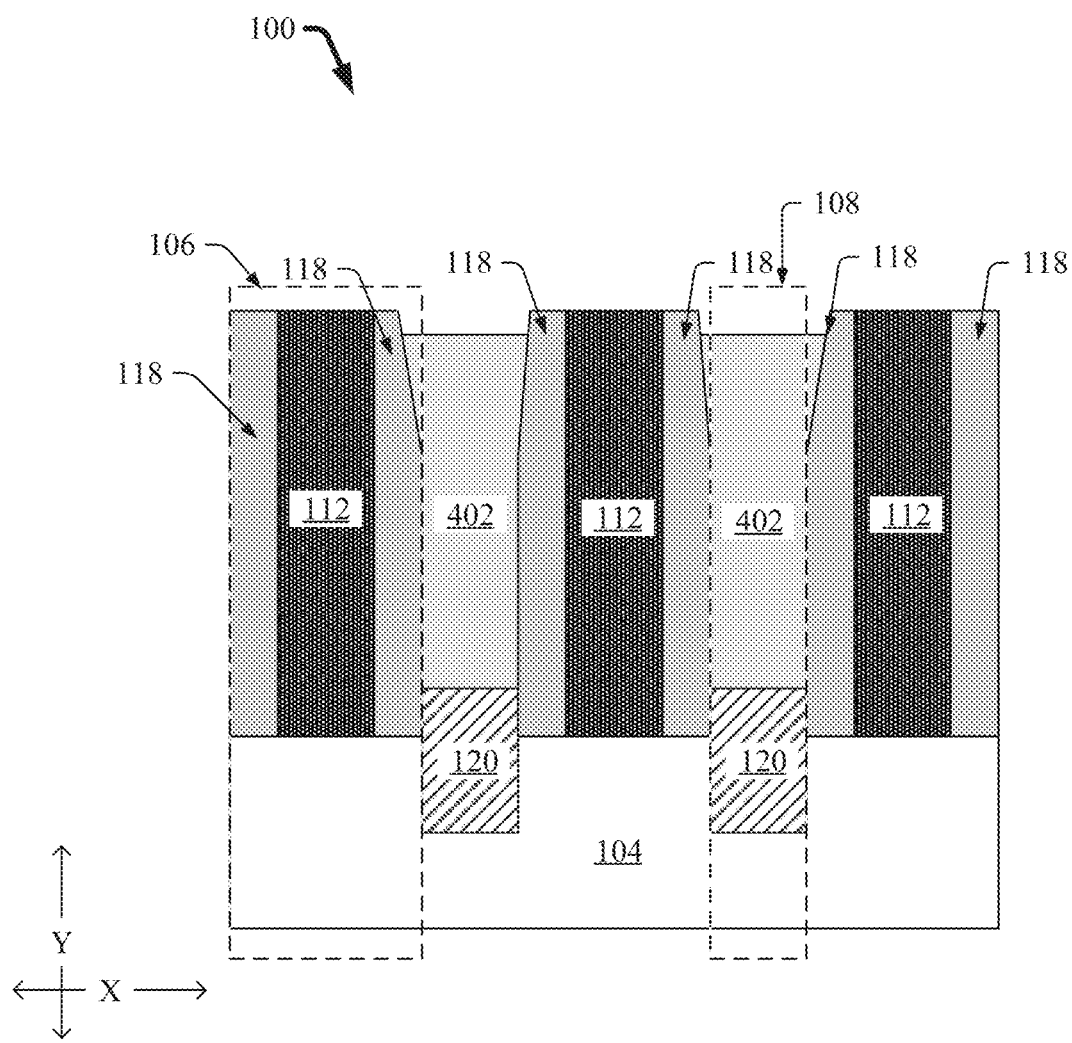
FIG. 4 illustrates a diagram of an example, non-limiting cross-sectional view of a non-SAC semiconductor device during a third stage of manufacturing in accordance with one or more embodiments described herein.

FIG. 4 illustrates a diagram of an example, non-limiting cross-sectional view of the one or more non-SAC semiconductor devices 100 during a third stage of manufacturing in accordance with one or more embodiments described herein. Repetitive description of like elements employed in other embodiments described herein is omitted for sake of brevity.

As shown in FIG. 4, at a third stage of manufacturing the one or more masks 302 can be removed and one or more sacrificial layers 402 can be deposited into the one or more recesses (e.g., created during the second stage of manufacturing) comprised primary within the one or more source/drain regions 108. As depicted in FIG. 4, the one or more sacrificial layers 402 can also be slightly deposited into the one or more gate regions 106 due to at least partial degradation of one or more sidewall spacers 118. For example, the one or more sacrificial layers 402 can be deposited into one or more recesses defined by the one or more sidewall spacers 118. Further, the one or more sacrificial layers 402 can be deposited onto the one or more source/drain layers 120. In one or more embodiments, the one or more sacrificial layers 402 can comprise one or more OPLs.

In various embodiments, the third stage of manufacturing can comprise depositing the one or more sacrificial layers 402 onto the gate regions 106 and the source/drain regions 108, wherein one or more subsequent etching processes (e.g., wet etching, dry etching, and/or plasma etching) can be implemented to remove portions of the one or more sacrificial layers 402 from the one or more gate regions 106 (e.g., thereby exposing the one or more gates 110 and/or sidewall spacers 118) and achieving the structure depicted in FIG. 4. For example, the one or more sacrificial layers 402 can be deposited via one or more spin-on coating deposition techniques. As shown in FIG. 4, the one or more sacrificial layers 402 can extend from the one or more source/drain layers 120 to the distal end, or near to the distal end, of the one or more sidewall spacers 118.

Figure 5A:
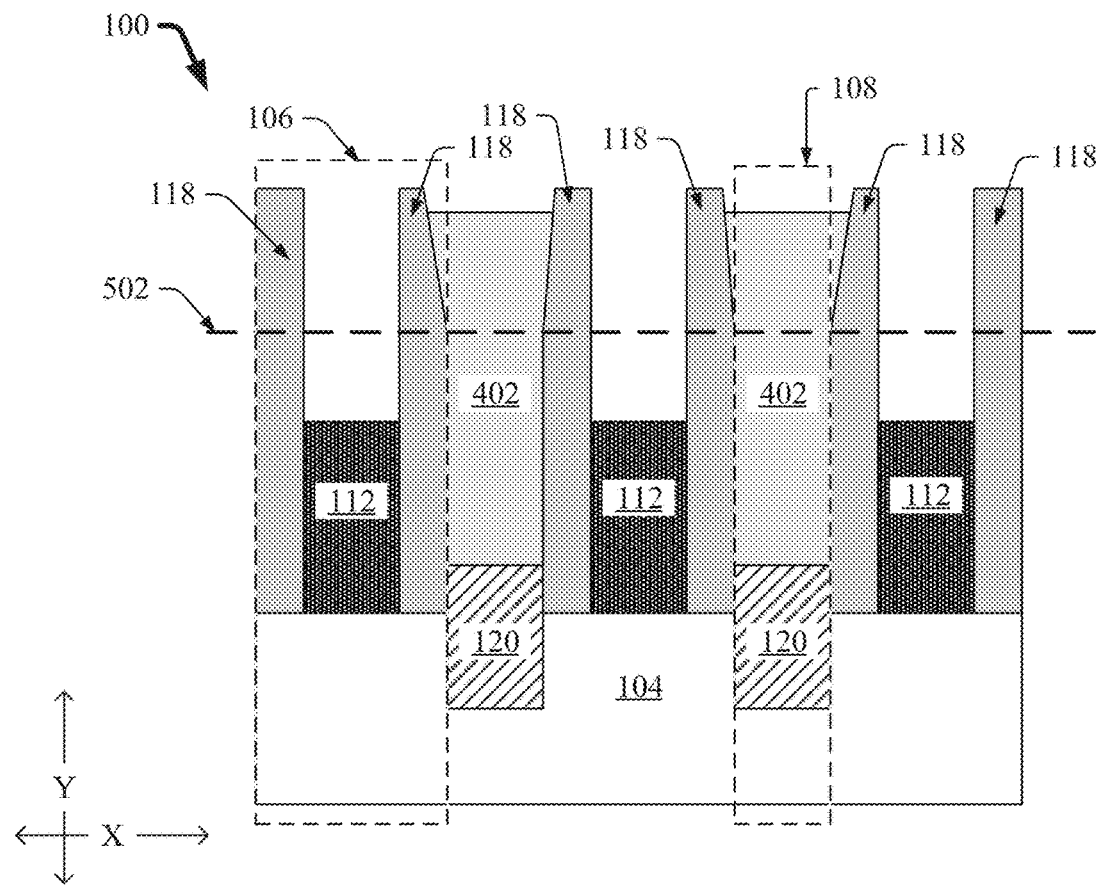
FIG. 5A illustrates a diagram of an example, non-limiting cross-sectional view of a non-SAC semiconductor device during a fourth stage of manufacturing in accordance with one or more embodiments described herein.

FIG. 5A illustrates a diagram of an example, non-limiting cross-sectional view of the one or more non-SAC semiconductor devices 100 during a fourth stage of manufacturing in accordance with one or more embodiments described herein. Repetitive description of like elements employed in other embodiments described herein is omitted for sake of brevity.

As shown in FIG. 5A, at the fourth stage of manufacturing the at least a portion of the one or more gate stack layers 112 can be removed from the gate regions 106. For example, one or more recesses can be formed within the one or more gate stack layers 112 between the one or more sidewall spacers 118 (e.g., as shown in FIG. 5A). The one or more recesses in the gate regions 106 can be facilitated by one or more WFM selective etching techniques. Example etching techniques that can be implemented to facilitate formation of the one or more recesses into the one or more gate stack layers 112 can include, but are not limited to: wet etching, dry etching, plasma etching, a combination thereof, and/or the like.

Further, the one or more recesses formed during the fourth stage of manufacturing can be formed extending to, or beyond, a degradation level 502 (e.g., delineated by a bold dashed line in FIG. 5A) of the one or more sidewall spacers 118. The degradation level 502 can be a height (e.g., along the "Y" axis) at which degradation (e.g., caused by misalignment of the one or more masks 302) of the one or more sidewall spacers 118 begins. Wherein multiple sidewall spacers 118 have experienced degradation during the second stage of manufacturing, the degradation level 502 can be set to the shortest height (e.g., along the "Y" axis) that characterizes the start of sidewall spacer 118 degradation. In other words, the one or more sidewall spacers 118 can be characterized by a non-tapered shape below the degradation level 502 and a tapered shape above the degradation level 502.

Thereby, the one or more recesses into the one or more gate stack layers 112 can extend from a distal end of the one or more sidewall spacers 118 to a point beyond the degradation level 502 (e.g., as shown in FIG. 5A). As a result of the one or more recess formations during the fourth stage of manufacturing, the one or more gate stack layers 112 can extend from the one or more semiconductor substrates 104 to height (e.g., along the "Y" axis) that is below the degradation level 502. Thus, the portions of the one or more gate stack layers 112 remaining after the one or more recess formations can be adjacent to non-tapered sections of the one or more sidewall spacers 118.

Figure 5B:
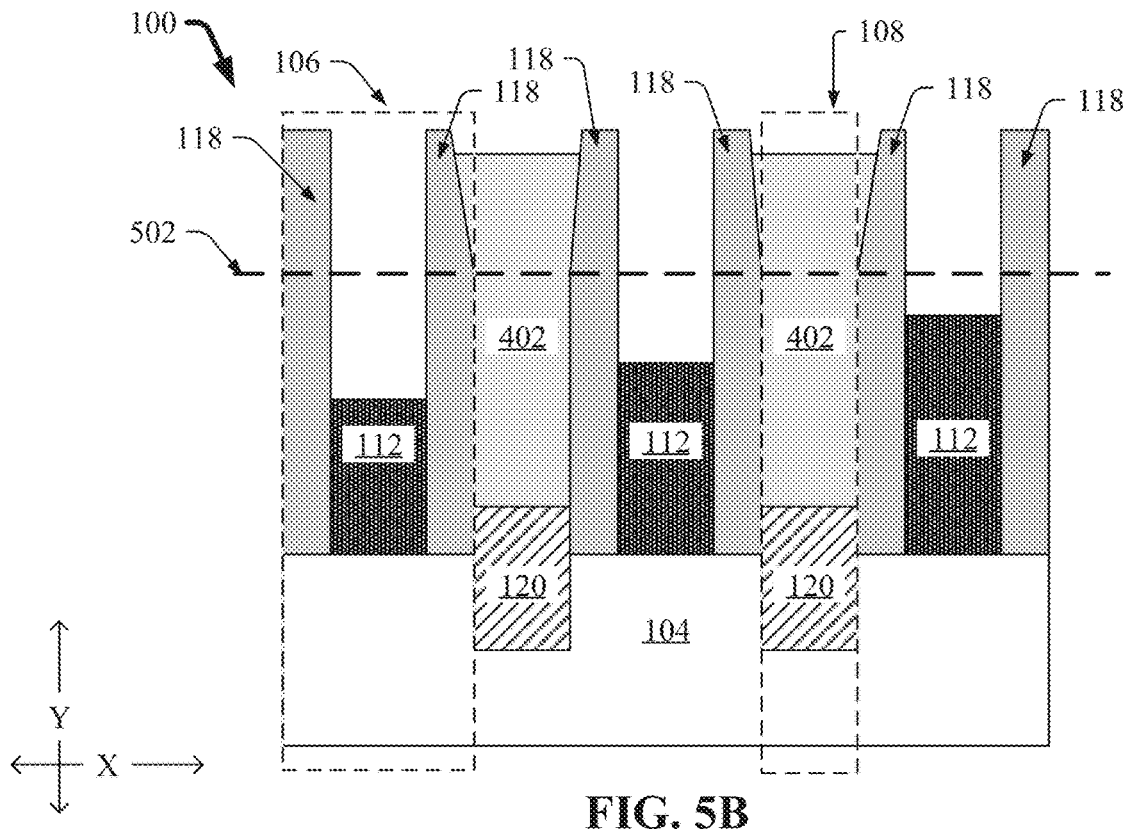
FIG. 5B illustrates a diagram of an example, non-limiting cross-sectional view of a non-SAC semiconductor device during the fourth stage of manufacturing in accordance with one or more embodiments described herein.

FIG. 5B illustrates a diagram of another example, non-limiting cross-sectional view of the one or more non-SAC semiconductor devices 100 during the fourth stage of manufacturing in accordance with one or more embodiments described herein. Repetitive description of like elements employed in other embodiments described herein is omitted for sake of brevity. As shown in FIG. 5B, the recesses formed during the fourth stage of manufacturing can extend to non-uniform depths.

For example, one or more recesses formed during the fourth stage of manufacturing can extend to a first depth into the one or more gate stack layers 112, while one or more other recesses formed during the fourth stage of manufacturing can extend to a second depth into the one or more gate stack layers 112, wherein the first depth can be different than the second depth. Thereby, the recess depths for each respective gate region 106 can be non-uniform, wherein the one or more recesses formed at the fourth stage of manufacturing can extend from a distal end of the one or more sidewall spacers 118 to a point below the degradation level 502 (e.g., as described herein).

In conventional non-SAC manufacturing methods, uniform recess depths into the one or more gate stack layers 112 can be of high importance. For example, non-uniform recess depths result in non-uniform heights of the one or more gate stack layers 112, which can cause gate cap non-uniformity and/or gate resistance variation in conventional techniques. Advantageously, the structures and/or methods described herein can enable non-uniform recess depths into the one or more gate stack layers 112 and/or non-uniform heights of the one or more gate stack layers 112 for each gate region 106 (e.g., as shown in FIG. 5B).

Figure 6:
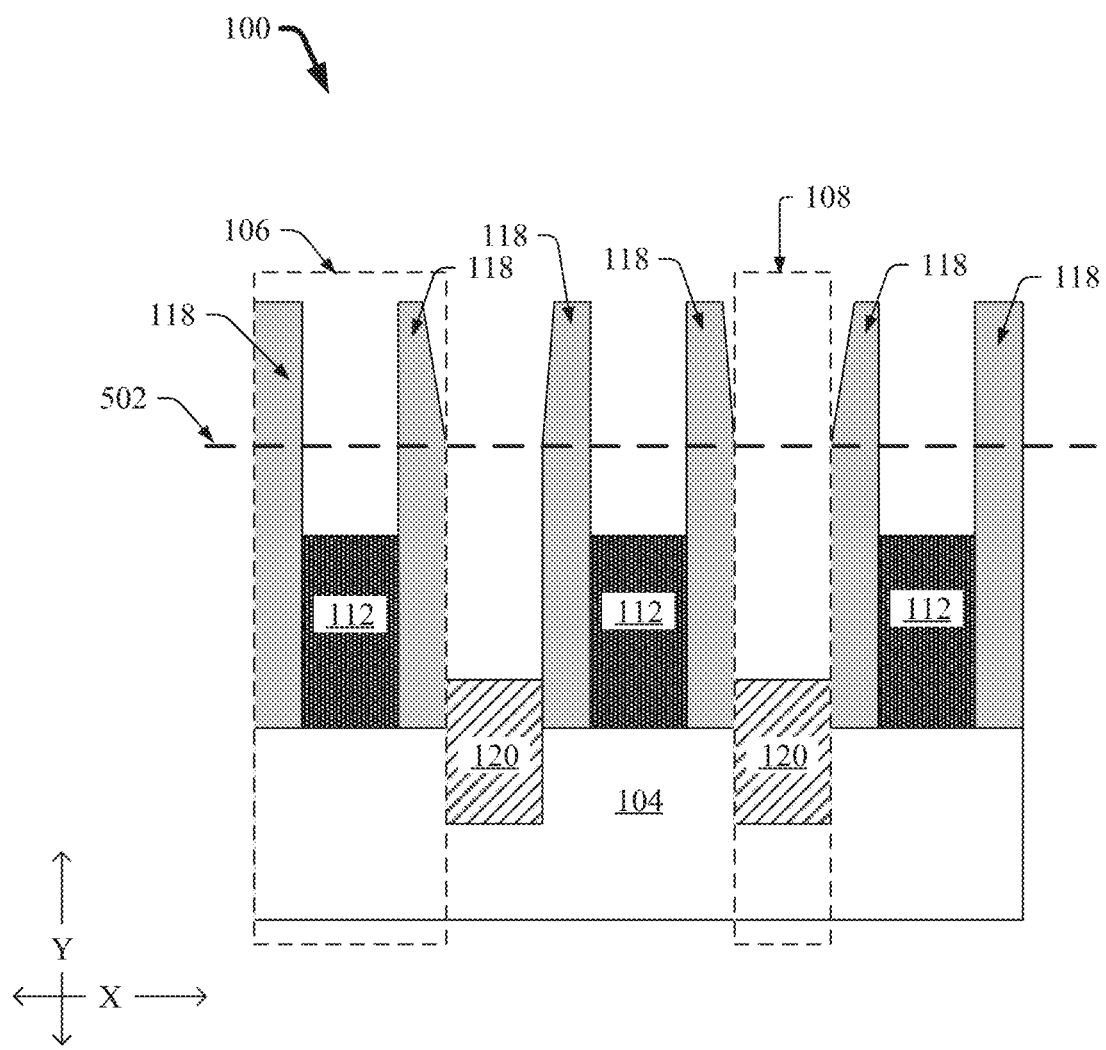
FIG. 6 illustrates a diagram of an example, non-limiting cross-sectional view of a non-SAC semiconductor device during a fifth stage of manufacturing in accordance with one or more embodiments described herein.

FIG. 6 illustrates a diagram of an example, non-limiting cross-sectional view of the one or more non-SAC semiconductor devices 100 during a fifth stage of manufacturing in accordance with one or more embodiments described herein. Repetitive description of like elements employed in other embodiments described herein is omitted for sake of brevity. As shown in FIG. 6, at the fifth stage of manufacturing the one or more sacrificial layers 402 can be removed from the one or more source/drain regions 108. For example, removal of the one or more sacrificial layers 402 can be facilitated by one or more etching processes. Example etching processes that can be implemented during the fifth stage of manufacturing can include, but are not limited to: wet etching, dry etching, plasma etching, an ashing process (e.g., using a nitrogen/hydrogen ($N_2/H_2$) dry ash), a combination thereof, and/or the like.

Figure 7:
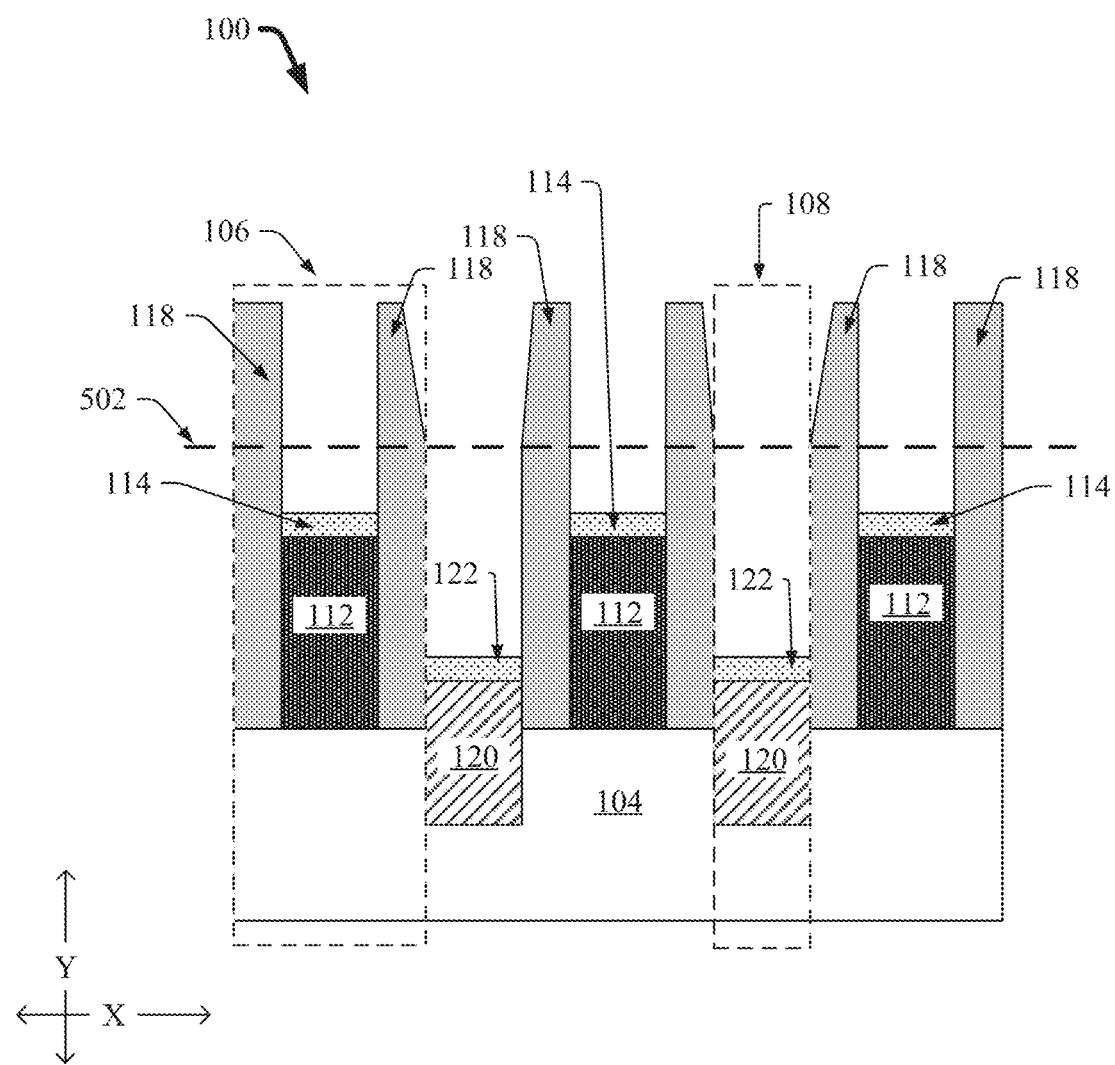
FIG. 7 illustrates a diagram of an example, non-limiting cross-sectional view of a non-SAC semiconductor device during a sixth stage of manufacturing in accordance with one or more embodiments described herein.

FIG. 7 illustrates a diagram of an example, non-limiting cross-sectional view of the one or more non-SAC semiconductor devices 100 during a sixth stage of manufacturing in accordance with one or more embodiments described herein. Repetitive description of like elements employed in other embodiments described herein is omitted for sake of brevity.

As shown in FIG. 7, at the sixth stage of manufacturing the one or more metal liners 114 and/or second metal liners 122 can be deposited onto the one or more gate stack layers 112 and/or source/drain layers 120 respectively. For example, the one or more metal liners 114 can be deposited onto the one or more gate stack layers 112 within the one or more gate regions 106. Also, the one or more second metal liners 122 can be deposited onto the one or more source/drain layers 120 within the one or more source/drain regions 108. Deposition techniques that can facilitate the depositing during the sixth stage of manufacturing can include, but are not limited to: radio frequency physical vapor deposition ("RFVPD"), a directional metal deposition process, a combination thereof, and/or the like.

In one or more embodiments, the one or more metal liners 114 and/or second metal liners 122 can be deposited via separate depositions during the sixth stage of manufacturing. Alternatively, in various embodiments the one or more metal liners 114 and/or second metal liners 122 can be deposited via the same deposition during the sixth stage of manufacturing. For example, the one or more metal liners 114 and/or second metal liners 122 can be deposited via the same deposition when the one or more metal liners 114 and/or second metal liners 122 have the same, or substantially the same, composition. For instance, the one or more metal liners 114 and/or second metal liners 122 can both comprise titanium and/or can be deposited via a RFVD technique. Further, the one or more metal liners 114 and/or second metal liners 122 can comprise materials that form a silicide with the one or more source/drain layers 120.

Figure 8:
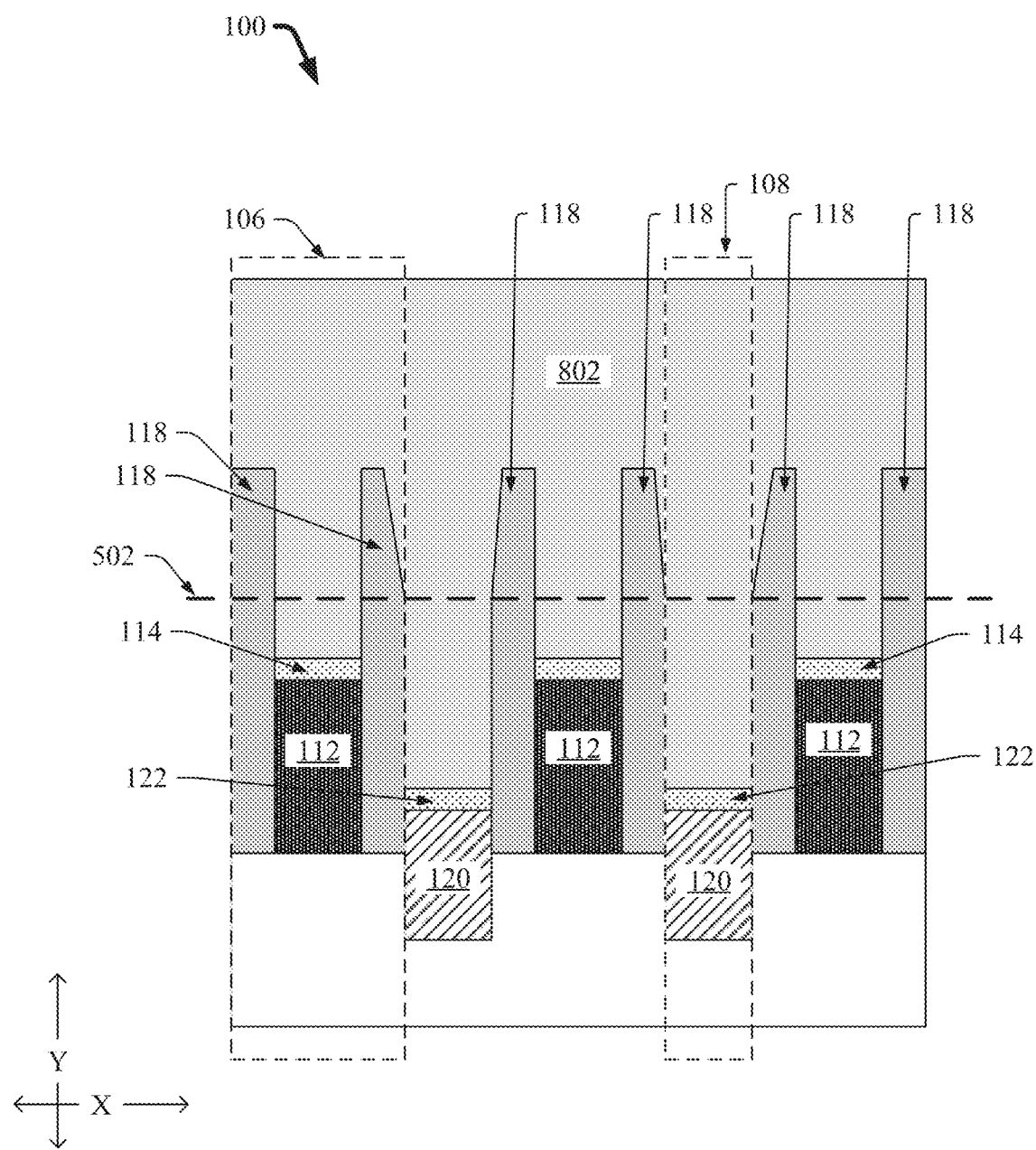
FIG. 8 illustrates a diagram of an example, non-limiting cross-sectional view of a non-SAC semiconductor device during a seventh stage of manufacturing in accordance with one or more embodiments described herein.

FIG. 8 illustrates a diagram of an example, non-limiting cross-sectional view of the one or more non-SAC semiconductor devices 100 during a seventh stage of manufacturing in accordance with one or more embodiments described herein. Repetitive description of like elements employed in other embodiments described herein is omitted for sake of brevity.

As shown in FIG. 8, at the seventh stage of manufacturing one or more filling metal layers 802 can be deposited into the one or more gate regions 106 and/or source/drain regions 108. The one or more filling metal layers 802 can fill the recesses in the one or more gate regions 106 (e.g., formed by removing at least a portion of the one or more gate stack layers 112 during the fourth stage of manufacturing) and/or source/drain regions 108 (e.g., formed by removing the one or more sacrificial layers 402 during fifth stage of manufacturing).

Further, the one or more filling metal layers 802 can have the same composition as the one or more second metal layers 116 and/or third metal layers 124. In various embodiments, the one or more second metal layers 116 and third metal layers 124 can have a first composition; and thereby, the one or more filling metal layers 802 can also have the first composition. For instance, the one or more filling metal layers 802, second metal layers 116, and/or third metal layers 124 can all comprise cobalt. Moreover, the one or more filling metal layers 802 can serve as the basis for development of the one or more second metal layers 116 and/or third metal layers 124.

Figure 9:
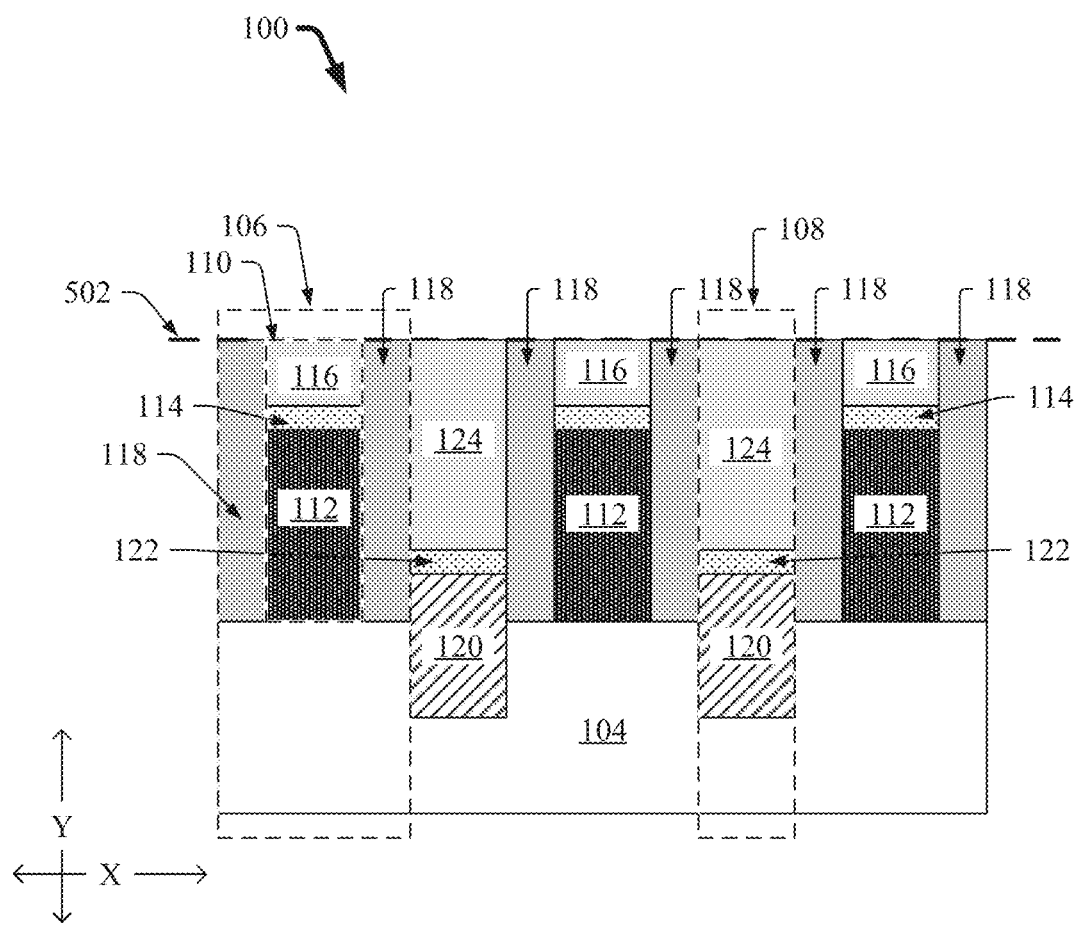
FIG. 9 illustrates a diagram of an example, non-limiting cross-sectional view of a non-SAC semiconductor device during an eighth stage of manufacturing in accordance with one or more embodiments described herein.

FIG. 9 illustrates a diagram of an example, non-limiting cross-sectional view of the one or more non-SAC semiconductor devices 100 during an eighth stage of manufacturing in accordance with one or more embodiments described herein. Repetitive description of like elements employed in other embodiments described herein is omitted for sake of brevity.

As shown in FIG. 9, at the eighth stage of manufacturing one or more portions of the of one or more filling metal layers 802 and/or sidewall spacers 118 can be removed to form the one or more second metal layers 116 and/or third metal layers 124. Example removal techniques that can be implemented at the eighth stage of manufacturing can include, but are not limited to: chemical-mechanical polishing ("CMP"), a non-selective etching process, a combination thereof, and/or the like. For example, the portions of the one or more filling metal layers 802 and/or sidewall spacers 118 located above the degradation level 502 can be removed during the eighth stage of manufacturing. For instance, one or more CMP techniques can be utilized during the eighth stage of manufacturing to remove material down to the degradation level 502 (e.g., along the "Y" axis).

As a result of the removal of material during the eighth stage of manufacturing, the one or more second metal layers 116 and/or third metal layers 124 can be formed from the one or more filling metal layers 802 and/or respectively isolated by one or more sidewall spacers 118. Further, as a result of the removal of material during the eighth stage of manufacturing, the remaining portions of the one or more sidewall spacers 118 can have a non-tapered shape (e.g., can be free from any degradation experienced during the second stage of manufacturing). Thereby, the one or more gates 110 can extend from one or more semiconductor substrates 104 to the degradation level 502 (e.g., as shown in FIG. 9). Also, the one or more third metal layers 124 (e.g., local interconnect metal plugs) can extend from the one or more source/drain layers 120 to the degradation level 502 (e.g., as shown in FIG. 9).

Subsequent to the eighth stage of manufacturing, the final structure of the one or more non-SAC semiconductor devices 100 (e.g., as shown in FIGS. 1A-B) can be achieved during a ninth stage of manufacturing, which can comprise: depositing the one or more ILDs 126 onto the one or more gates 110 and/or third metal layers 124; forming one or more vias within the one or more ILDs 126; and/or filling the one or more vias with one or more electrically conductive metals to form the one or more gate contacts 102 and/or source/drain contacts 128. Example deposition techniques that can be implemented to deposit the one or more ILDs 126 can include, but are not limited to: physical vapor deposition, chemical vapor deposition, electrochemical deposition, atomic layer deposition, a combination thereof, and/or the like. Example etching techniques that can facilitate formation of the one or more vias within the one or more ILDs 126 can include, but are not limited to: wet etching, dry etching, plasma etching, a combination thereof, and/or the like. Further, example deposition techniques that can facilitate depositing the one or more electrically conductive metals and forming the one or more contacts (e.g., one or more gate contacts 102 and/or source/drain contacts 128) can include, but are not limited to: physical vapor deposition, chemical vapor deposition, electrochemical deposition, atomic layer deposition, a combination thereof, and/or the like.

FIG. 10 illustrates a flow diagram of an example, non-limiting method 1000 that can facilitate manufacturing of one or more non-SAC semiconductor devices 100 in accordance with one or more embodiments described herein. Repetitive description of like elements employed in other embodiments described herein is omitted for sake of brevity.

At 1002, the method 1000 can comprise forming one or more recesses in one or more gate regions 106 of a semiconductor body (e.g., one or more semiconductor substrates 104) of a FET by removing one or more portions of a dielectric metal and/or gate metal (e.g., one or more gate stack layers 112). The forming of the one or more recesses at 1002 can be performed in accordance with the fourth stage of manufacturing described herein. For example, the one or more recesses can be formed to a depth extending to, or beyond, a degradation level 502 (e.g., as shown in FIG. 5A), which can be indicative of an amount of degradation (e.g., caused by a misalignment of one or more etching masks 302, as described herein) experienced by one or more sidewall spacers 118 also positioned within the one or more gate regions 106. The one or more recesses formed at 1002 can have a uniform or non-uniform depth (e.g., as shown in FIG. 5B).

At 1004, the method 1000 can comprise depositing one or more metal liners 114 into the one or more recesses. For example, the depositing at 1004 can be performed in accordance with the sixth stage of manufacturing described herein. For instance, the one or more metal liners 114 can be deposited onto the remaining dielectric metal and/or gate metal (e.g., remaining portions of the one or more gate stack layers 112). Further, the one or more metal liners 114 can be deposited between the sidewall spacers 118 comprised within the one or more gate regions 106 (e.g., as shown in FIG. 7). Example materials that can be comprised within the one or more metal liners 114 can include, but are not limited to: titanium (Ti), nickel (Ni), nickel-platinum (NiPt), platinum (Pt), a combination thereof, and/or the like. Example deposition techniques that can be implemented to facilitate the depositing at 1004 can include, but are not limited to: RFVPD, a directional metal deposition process, a combination thereof, and/or the like.

At 1006, the method 1000 can comprise depositing one or more metal layers (e.g., filling metal layers 802 and/or second metal layers 116) onto the one or more metal liners 114 thereby forming one or more gates 110 positioned adjacent to the semiconductor body (e.g., semiconductor substrate 104) at the one or more gate regions 106. For example, the depositing at 1006 can be performed in accordance with the seventh and/or eighth stages of manufacturing described herein. For instance, the one or more metal layers (e.g., second metal layers 116) can be deposited onto the one or more metal liners 114 and/or between sidewall spacers 118 of the one or more gates 110. Example materials that can be comprised within the one or more metal layers (e.g., filling metal layers 802 and/or second metal layers 116) can include, but are not limited to: cobalt (Co), ruthenium (Ru), copper (Cu), a combination thereof, and/or the like. Example deposition techniques that can be implemented to facilitate the depositing at 1006 can include, but are not limited to: physical vapor deposition, chemical vapor deposition, electrochemical deposition, atomic layer deposition, a combination thereof, and/or the like.

In various embodiments, the one or more metal layers (e.g., filling metal layers 802) can be deposited into the one or more gate regions 106 and source/drain regions 108 (e.g., as shown in FIG. 8), whereupon one or more material removal processes (e.g., "CMP") can isolate one or more first portions of the one or more metal layers to the one or more gates 110 and/or one or more second portions of the one or more metal layers to the one or more source/drain regions 108 (e.g., as shown in FIG. 9). Thereby, the method 1000 can form one or more multi-layered gates 110 comprising a metal liner 114 serving as an interface between a metal layer (e.g., second metal layer 116) and a dielectric metal (e.g., gate stack layer 112), wherein the multi-layered gates 110 can also comprise one or more sidewall spacers 118 that are free, or substantially free, of degradation.

FIG. 11 illustrates a flow diagram of an example, non-limiting method 1100 that can facilitate manufacturing of one or more non-SAC semiconductor devices 100 in accordance with one or more embodiments described herein. Repetitive description of like elements employed in other embodiments described herein is omitted for sake of brevity.

At 1102, the method 1100 can comprise forming one or more first recesses in a source/drain region 108 of a semiconductor body (e.g., a semiconductor substrate 104) of a FET, wherein the semiconductor body can comprise one or more gate regions 106 positioned laterally adjacent to the one or more source/drain regions 108, and wherein one or more dielectric sidewall spacers (e.g., sidewall spacers 118) can be comprised within the one or more gate regions 106. For example, the forming at 1102 can be performed in accordance with the second stage of manufacturing described herein. For instance, one or more masks 302 can be utilized to align formation of the one or more first recesses with the one or more source/drain regions 108. As described herein, misalignments of the one or more masks 302 can result in at least partial degradation of the one or more dielectric sidewall spacers during the forming at 1102.

At 1104, the method 1100 can comprise depositing one or more sacrificial layers 402 into the one or more first recesses. For example, the depositing at 1104 can be performed in accordance with the third stage of manufacturing described herein. For instance, the one or more sacrificial layers 402 can be deposited into the one or more source/drain regions 108 and/or at least partially into the one or more gate regions 106 (e.g., due to degradation experienced by the one or more dielectric sidewall spacers defining the one or more source/drain regions 108). In various embodiments, the one or more sacrificial layers 402 can comprise one or more OPLs.

At 1106, the method 1100 can comprise forming one or more second recesses in one or more gate regions 106 by removing one or more portions of a gate dielectric and/or gate metal (e.g., gate stack layers 112). For example, forming the one or more second recesses at 1106 can be performed in accordance with the fourth stage of manufacturing described herein. For instance, the one or more second recesses can be formed to a depth extending to, or beyond, a degradation level 502 (e.g., as shown in FIG. 5A), which can be indicative of the amount of dielectric sidewall spacer degradation experienced during the formation of the one or more first recesses at 1102. The one or more second recesses formed at 1106 can have a uniform or non-uniform depth (e.g., as shown in FIG. 5B).

At 1108, the method 1100 can comprise forming one or more third recesses in the one or more source/drain regions 108 by removing the one or more sacrificial layers 402. For example, the forming the one or more third recesses at 1108 can be performed in accordance with the fifth stage of manufacturing described herein. For instance, formation of the one or more third recesses can expose one or more source/drain layers 120 positioned within the one or more source/drain regions 108 and/or adjacent to the semiconductor body (e.g., semiconductor substrate 104).

At 1110, the method 1100 can comprise depositing one or more metal liners (e.g., metal liners 114) into the one or more second recesses. For example, the depositing at 1110 can be performed in accordance with the sixth stage of manufacturing described herein. For instance, the one or more metal liners can be deposited in the one or more gate regions 106 and/or between the dielectric sidewall spacers (e.g., sidewall spacers 118) to form the one or more metal liners 114 described herein. Example materials that can be comprised within the one or more metal liners can include, but are not limited to: titanium (Ti), nickel (Ni), nickel-platinum (NiPt), platinum (Pt), a combination thereof, and/or the like. Example deposition techniques that can be implemented to facilitate the depositing at 1110 can include, but are not limited to: RFVPD, a directional metal deposition process, a combination thereof, and/or the like.

At 1112 the method 1100 can comprise depositing the one or more metal liners (e.g., second metal liners 122) into the one or more third recesses. For example, the depositing at 1112 can be performed in accordance with the sixth stage of manufacturing described herein. For instance, the one or more metal liners can be deposited in the one or more source/drain regions 108 and/or between the dielectric sidewall spacers (e.g., sidewall spacers 118) to form the one or more second metal liners 122 described herein. Example materials that can be comprised within the one or more metal liners can include, but are not limited to: titanium (Ti), nickel (Ni), nickel-platinum (NiPt), platinum (Pt), a combination thereof, and/or the like. Example deposition techniques that can be implemented to facilitate the depositing at 1112 can include, but are not limited to: RFVPD, a directional metal deposition process, a combination thereof, and/or the like.

In various embodiments, the depositing at 1110 and 1112 can be performed in a single step. For example, the one or more metal liners 114 comprised within the one or more gate regions 106 and the one or more second metal liners 122 comprised within the one or more source/drain regions 108 can be comprised of the same material. Further, a deposition technique (e.g., RFVPD) can be implemented to facilitate the depositing at 1110 and 1112 simultaneously.

At 1114, the method 1100 can comprise depositing one or more metal layers (e.g., second metal layers 116) onto the one or more metal liners within the one or more second recesses (e.g., the one or more metal liners 114) thereby forming one or more gates 110 positioned adjacent to the semiconductor body (e.g., semiconductor substrate 104) at the one or more gate regions 106. For example, the depositing at 1114 can be performed in accordance with the seventh and/or eighth stages of manufacturing described herein. For instance, the one or more metal layers can be deposited in the one or more gate regions 106 and/or between the dielectric sidewall spacers (e.g., sidewall spacers 118) to form the one or more second metal layers 116 described herein. Example materials that can be comprised within the one or more metal layers can include, but are not limited to: cobalt (Co), ruthenium (Ru), copper (Cu), a combination thereof, and/or the like. Example deposition techniques that can be implemented to facilitate the depositing at 1114 can include, but are not limited to: physical vapor deposition, chemical vapor deposition, electrochemical deposition, atomic layer deposition, a combination thereof, and/or the like.

At 1116, the method 1100 can comprise depositing the one or more metal layers (e.g., third metal layers 124) onto the one or more metal liners within the one or more third recess to form one or more metal plugs positioned adjacent to the semiconductor body (e.g., semiconductor substrate 104) at the one or more source/drain regions 108. For example, the depositing at 1116 can be performed in accordance with the seventh stage of manufacturing described herein. For instance, the one or more metal layers can be deposited in the one or more source/drain regions 108 and/or between the dielectric sidewall spacers (e.g., sidewall spacers 118) to form the one or more third metal layers 124 described herein. Example materials that can be comprised within the one or more metal layers can include, but are not limited to: cobalt (Co), ruthenium (Ru), copper (Cu), a combination thereof, and/or the like. Example deposition techniques that can be implemented to facilitate the depositing at 1116 can include, but are not limited to: physical vapor deposition, chemical vapor deposition, electrochemical deposition, atomic layer deposition, a combination thereof, and/or the like.

In various embodiments, the depositing at 1114 and 1116 can be performed in a single step. For example, the one or more second metal layers 116 comprised within the one or more gate regions 106 and the one or more third metal layers 124 comprised within the one or more source/drain regions 108 can be comprised of the same material. Further, a deposition technique can be implemented to facilitate the depositing at 1114 and 1116 simultaneously. For instance, the depositing at 1114 and 1116 can be facilitated by depositing one or filling metal layers 802, as described herein, wherein a subsequent removal of excess material of the one or more filling metal layers 802 can further define the structure of the one or more second metal layers 116 and/or third metal layers 124 (e.g., as shown and/or described in reference to FIGS. 8-9).

At 1118, the method 1100 can comprise performing one or more CMP processes to the FED to remove excess amounts of the metal layer (e.g., deposited at 1114 and/or 1116) covering the one or more gates 110, dielectric sidewall spacers (e.g., sidewall spacers 118), and/or metal plugs (e.g., third metal layers 124 positioned within the one or more source/drain regions 108 and between sidewall spacers 118). For example, performing the one or more CMP processes at 1118 can be implemented in accordance with the eighth stage of manufacturing described herein. For instance, the one or more CMP processes can remove material at or above the degradation level 502. In other words, the one or more CMP processes at 1118 can remove material adjacent to the tapered portions of the one or more dielectric sidewall spacers. Thereby, the portions of the one or more gates 110 and/or metal plugs remaining after the one or more CMP processes can be adjacent to non-tapered (e.g., degradation free) segments of the one or more dielectric sidewall spacers.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
forming a first recess in a gate region of a semiconductor body of a field effect transistor by removing a portion of a gate metal;
depositing a metal liner into the first recess; and
depositing a metal layer onto the metal liner thereby forming a gate positioned adjacent to the semiconductor body at the gate region.

2. The method of claim 1, wherein the semiconductor body comprises the gate region positioned laterally adjacent to a source/drain region, and wherein a dielectric sidewall spacer is comprised within the gate region.

3. The method of claim 2, further comprising:
removing a tapered portion of the dielectric sidewall spacer.

4. The method of claim 3, wherein the removing the tapered portion comprises applying a chemical mechanical planarization of the metal layer and the dielectric sidewall spacer.

5. The method of claim 2, further comprising:
prior to depositing the metal liner, forming a second recess in the source/drain region;
wherein the depositing the metal liner further comprises depositing the metal liner into the second recess; and
wherein the depositing the metal layer further comprises depositing the metal layer onto the metal liner within the second recess to form a metal plug positioned adjacent to the semiconductor body at the source/drain region.

6. The method of claim 5, further comprising:
forming a gate contact operatively coupled to the gate; and
forming a source/drain contact operatively coupled to the metal plug.

7. The method of claim 1, wherein the metal liner comprises titanium.

8. The method of claim 1, wherein the metal layer comprises cobalt.

9. The method of claim 1, wherein the gate metal comprises tungsten.

10. The method of claim 1, wherein the metal liner comprises at least one member selected from a group consisting of: titanium, nickel, a nickel-platinum compound, and platinum.

11. The method of claim 1, wherein the metal layer comprises at least one member selected from a group consisting of: ruthenium, and copper.

12. The method of claim 1, further comprising:
forming a dielectric sidewall spacer adjacent to the gate at the gate region, wherein a width of the dielectric sidewall spacer is substantially uniform throughout a height of the dielectric sidewall spacer.

13. The method of claim 5, further comprising:
forming a dielectric sidewall spacer positioned between the gate and the metal plug, wherein a width of the dielectric sidewall spacer is substantially uniform throughout a height of the dielectric sidewall spacer.

14. The method of claim 1, wherein the gate metal comprises at least one member selected from a group consisting of: titanium nitride, titanium carbide, and tantalum nitride.

15. The method of claim 1, wherein the gate region further comprises a gate dielectric layer that comprises at least one member selected from a group consisting of: hafnium oxide and zirconium dioxide.

16. The method of claim 1, wherein the metal liner has a thickness that is greater than or equal to 1 nanometer and less than or equal to 8 nanometer.

17. The method of claim 6, wherein the source/drain contact comprises at least one member selected from a group consisting of: boron doped silicon-germanium, phosphorous doped silicon, and arsenic doped silicon.

18. The method of claim 1, further comprising:
forming an interlayer dielectric layer positioned over the gate.

19. The method of claim 18, further comprising:
forming a via in the interlayer dielectric layer over the gate.

20. The method of claim 19, further comprising:
depositing a material comprising an electrically conducting metal in the via to form a gate contact operably coupled to the gate.

* * * * *